(12) United States Patent
Tsunekawa

(10) Patent No.: US 8,893,648 B2
(45) Date of Patent: Nov. 25, 2014

(54) ELECTROLESS PLATING APPARATUS, METHOD OF ELECTROLESS PLATING, AND MANUFACTURING METHOD OF PRINTED CIRCUIT BOARD

(75) Inventor: Makoto Tsunekawa, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 81 days.

(21) Appl. No.: 13/438,238

(22) Filed: Apr. 3, 2012

(65) Prior Publication Data

US 2012/0251733 A1    Oct. 4, 2012

(30) Foreign Application Priority Data

Apr. 4, 2011   (JP) ................. 2011-082643

(51) Int. Cl.
| | |
|---|---|
| B05C 3/09 | (2006.01) |
| B05C 5/00 | (2006.01) |
| B05C 3/02 | (2006.01) |
| C23C 18/16 | (2006.01) |
| C25D 21/12 | (2006.01) |
| C25D 17/10 | (2006.01) |
| C25D 17/00 | (2006.01) |
| H05K 3/18 | (2006.01) |
| H05K 1/05 | (2006.01) |

(52) U.S. Cl.
CPC ............... *C23C 18/1619* (2013.01); *B05C 3/02* (2013.01); *C25D 21/12* (2013.01); *C23C 18/1671* (2013.01); *H05K 2203/1545* (2013.01); *C25D 17/10* (2013.01); *C25D 17/00* (2013.01); *H05K 3/181* (2013.01); *H05K 1/056* (2013.01); *B05C 5/00* (2013.01); *B05C 3/09* (2013.01)
USPC ....................................................... 118/620

(58) Field of Classification Search
None
See application file for complete search history.

(56) References Cited

U.S. PATENT DOCUMENTS

| | | | | |
|---|---|---|---|---|
| 3,824,453 | A | * | 7/1974 | Baker ..................... 205/789.5 |
| 4,331,699 | A | * | 5/1982 | Suzuki et al. .................. 427/8 |
| 4,556,845 | A | * | 12/1985 | Strope et al. ................ 324/230 |
| 4,575,678 | A | * | 3/1986 | Hladky ....................... 205/776 |

(Continued)

FOREIGN PATENT DOCUMENTS

| | | |
|---|---|---|
| JP | S57-145969 A | 9/1982 |
| JP | S62-256968 A | 11/1987 |

(Continued)

OTHER PUBLICATIONS

Office Action issued Sep. 2, 2014 in JP Application No. 2011-082643.

*Primary Examiner* — Dah-Wei D Yuan
*Assistant Examiner* — Jethro M Pence
(74) *Attorney, Agent, or Firm* — Panitch Schwarze Belisario & Nadel LLP

(57) ABSTRACT

An electroless plating solution is contained in a plating tank of an electroless plating apparatus. A reference electrode and a counter electrode are immersed in the electroless plating solution. A conductive member is provided to be electrically in contact with a conductive layer formed of a long-sized substrate. The conductive member, the reference electrode, and the counter electrode are connected to a potentiostat. The potentiostat controls an electric current that flows between the conductive layer formed of the long-sized substrate and the counter electrode such that a potential of the conductive layer formed of the long-sized substrate (working electrode) is at a constant level with respect to a potential of the reference electrode.

4 Claims, 5 Drawing Sheets

(56) References Cited

U.S. PATENT DOCUMENTS

| | | | |
|---|---|---|---|
| 4,692,346 A * | 9/1987 | McBride et al. | 427/8 |
| 4,808,431 A * | 2/1989 | Rickert | 427/8 |
| 5,270,659 A | 12/1993 | Toyoda et al. | |
| 5,993,892 A * | 11/1999 | Wasserman et al. | 427/8 |
| 2008/0156650 A1 * | 7/2008 | Basame et al. | 205/83 |
| 2009/0291070 A1 * | 11/2009 | Freeman et al. | 424/94.4 |
| 2012/0043301 A1 * | 2/2012 | Arvin et al. | 216/86 |

FOREIGN PATENT DOCUMENTS

| | | |
|---|---|---|
| JP | S63-111179 A | 5/1988 |
| JP | H01-172577 A | 7/1989 |
| JP | 01275771 A | 11/1989 |
| JP | H03-271393 A | 12/1991 |
| JP | 04152261 A | 5/1992 |
| JP | 2638283 B2 | 8/1997 |

* cited by examiner

ELECTROLESS PLATING APPARATUS, METHOD OF ELECTROLESS PLATING, AND MANUFACTURING METHOD OF PRINTED CIRCUIT BOARD

BACKGROUND OF THE INVENTION (1) Field of the Invention

The present invention relates to an electroless plating apparatus, an electroless plating method, and a manufacturing method of a printed circuit board.

(2) Description of Related Art

In general, electroless plating is the process of depositing metals on the surface of an object to be plated by a reduction reaction without any electric current applied, in which a catalyst is attached on the surface of the object which is then immersed in an electroless plating solution. The electroless plating also allows plating of the surface of an insulting member with a metal film. Thus, the electroless plating has been widely used in the industry.

In recent years, various types of electronic equipment employ high-density and high-fineness printed circuit boards. In manufacturing such printed circuit boards, a metal thin film of nickel, chromium, or the like is formed on the surface of a wiring trace of copper by the elecctroless plating. In this case, the metal thin film can also be formed on very small conductive portions and insulator portions where establishing conduction is difficult.

In contrast to electroplating, the growth rate of the metal thin film is slow in the elecctroless plating, but as thickness variations within the surface is small. Therefore, the elecctroless plating is useful for providing a uniform metal thin film that does not require a large thickness.

JP 4-152261 A describes an electroless plating deposition rate measuring apparatus that measures a deposition rate of an electroless plating solution for the optimization of the thickness of the metal thin film formed by the electroless plating. The electroless plating deposition rate measuring apparatus measures a polarization resistance by periodic application of a voltage between the electrode pair in the electroless plating solution, and calculates the deposition rate of the electroless plating solution based on the measured polarization resistance. JP 4-152261 A describes that, by the use of the calculated deposition rate, the thickness of the metal thin film formed by the electroless plating is controlled to be an optimized value.

When the object is immersed in the electroless plating solution in the presence of a reference electrode in the electroless plating solution, a potential difference of about −450V occurs between the object and the reference electrode. This potential difference comes to a steady state at about −950V after a transient time of about several tens of seconds has passed. In this state, a chemical reaction of the plating process is started.

However, the transient time is affected by several factors including components, temperature, and an index of hydrogen ions of the electroless plating solution. In this context, an electroless plating apparatus described in JP 1-275771 A includes a first electrode which is in contact with the electroless plating solution, and a second electrode which is in contact with the object. A voltage of −950V is applied to the second electrode for two seconds from the stable power supply. A chemical reaction of electroless plating is thus forced to begin. As such, plating time is controlled.

BRIEF SUMMARY OF THE INVENTION

As described above, the electroless plating deposition rate measuring apparatus of JP 4-152261 A can be used to measure a metal deposition rate of the electroless plating solution.

Also, the electroless plating apparatus of JP 1-275771 A can be used to forcedly start the chemical reaction of plating process at a particular time.

However, since the electroless plating is a chemical reaction, the plating solution deteriorates as it is used continuously. The deposition rate changes depending on the degree of deterioration of the electroless plating solution. This leads to uneven thickness of the metal thin film formed by electroless plating. To achieve uniform thickness of the metal thin film, it is necessary to change the feeding speed or plating time of the object. As a result, the control of the feeding speed or plating time of the object becomes complicated.

An object of the present invention is to provide an electroless plating apparatus capable of forming a uniform metal thin film on the surface of an object with simple control, an electroless plating method, and a manufacturing method of a printed circuit board using the same.

(1) According to an aspect of the present invention, an electroless plating apparatus that performs electroless plating on an object having a conductive portion includes a plating tank for containing an electroless plating solution, a reference electrode arranged to be in contact with the electroless plating solution in the plating tank, and a controller for maintaining a potential of the conductive portion of the object at a constant level with respect to a potential of the reference electrode.

In the electroless plating apparatus, the potential of the conductive portion of the object is maintained at a constant level with respect to the potential of the reference electrode. As a result, even when the state of the electroless plating solution is changed, it is possible to keep a constant metal deposition rate on the conductive portion of the object. Accordingly, a uniform metal thin film can be formed on the conductive portion of the object with simple control.

(2) The electroless plating apparatus may further includes a counter electrode arranged to be in contact with the electroless plating solution in the plating tank, and the controller may control an electric current that flows between the conductive portion of the object and the counter electrode such that a potential of the conductive portion of the object with respect to the reference electrode is at a constant level.

In this case, the electric current that flows between the conductive portion of the object and the counter electrode is controlled, whereby the potential of the conductive portion of the object with respect to the reference electrode can be easily maintained at a constant level.

(3) The controller may include a potentiostat that is connected to the conductive portion of the object, the reference electrode and the counter electrode.

In this case, the potentiostat controls the electric current that flows between the conductive portion of the object and the counter electrode, whereby the potential of the conductive portion of the object with respect to the reference electrode can be easily maintained at a constant level.

(4) According to another aspect of the present invention, an electroless plating method for performing electroless plating on an object having a conductive portion includes the steps of accommodating an electroless plating solution in a plating tank, arranging a reference electrode in the plating tank so as to be in contact with the electroless plating solution, immersing the object in the electroless plating solution in the plating tank, and maintaining a potential of the conductive portion of the object at a constant level with respect to a potential of the reference electrode.

In the electroless plating method, the potential of the conductive portion of the object is maintained at a constant level with respect to the potential of the reference electrode. As a result, even when the state of the electroless plating solution is changed, it is possible to keep a constant metal deposition rate on the conductive portion of the object. Accordingly, a uniform metal thin film can be formed on the conductive portion of the object with simple control.

(5) The electroless plating method may further includes the step of arranging a counter electrode in the plating tank so as to be contact with the elecctroless plating solution, and the step of maintaining the potential of the conductive portion at the constant level may include the step of controlling the electric current that flows between the conductive portion of the object and the counter electrode such that the potential of the conductive portion of the object is at the constant level.

In this case, the electric current that flows between the conductive portion of the object and the counter electrode is controlled, whereby the potential of the conductive portion of the object with respect to the reference electrode can be easily maintained at a constant level.

(6) The step of controlling the electric current may include the step of controlling the electric current that flows between the reference electrode and the counter electrode by using the potentiostat.

In this case, the potentiostat controls the electric current that flows between the conductive portion of the object and the counter electrode, whereby the potential of the conductive portion of the object with respect to the reference electrode can be easily maintained at a constant level.

(7) According to further aspect of the present invention, a method of manufacturing a printed circuit board includes the steps of forming a conductive layer having a predetermined pattern on an insulating layer, and forming a metal thin film on the surface of the conductive layer by the electroless plating method according to the above other aspect of the invention.

In this case, even when the state of the electroless plating solution is changed, it is possible to provide a uniform metal thin film on the surface of the conductive layer of the printed circuit board with simple control.

Thus, according to the present invention, a uniform metal thin film can be formed on the conductive portion of the object with simple control.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
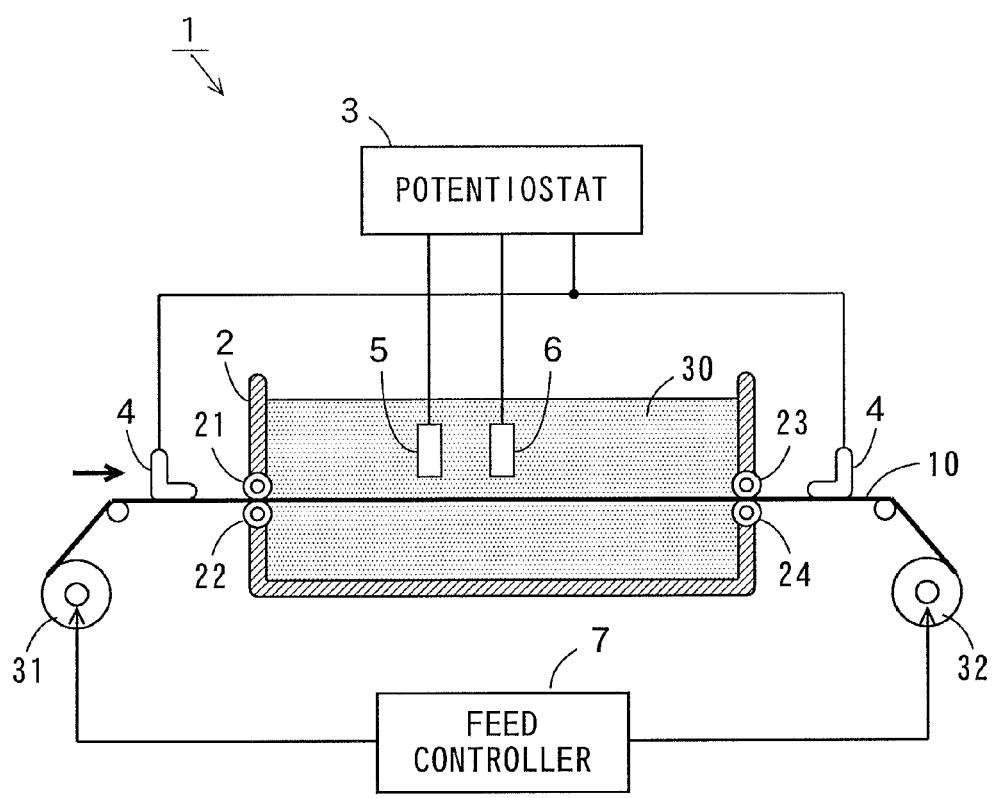
FIG. 1 is a schematic diagram showing an electroless plating apparatus according to an embodiment of the present invention.

Description will be made of an electroless plating apparatus and an electroless plating method according to one embodiment of the present invention while referring to the drawings.

(1) Configuration of the Electroless Plating Apparatus

FIG. 1 is a schematic diagram showing a configuration of an electroless plating apparatus according to an embodiment of the present invention. An electroless plating apparatus 1 of FIG. 1 is used to plate a long-sized substrate 10 that is an object to be plated.

The electroless plating apparatus 1 of FIG. 1 includes a plating tank 2. The plating tank 2 contains an electroless plating solution 30. In this embodiment, the electroless plating solution 30 includes nickel (Ni) ions.

Openings are provided, one in each of a pair of opposite side walls of the plating tank 2. A pair of horizontally extending feed rollers 21, 22 are rotatably provided to close one of the openings. Also, a pair of horizontally extending feed rollers 23, 24 are rotatably provided to close the other of the openings.

The long-sized substrate 10 is fed from a feed roll 31. The long-sized substrate 10 passes between the feed rollers 21, 22 into the plating tank 2 and proceeds through the pair of feed rollers 23, 24 to be wound by a winder roll 32. Thus, the long-sized substrate 10 is transported in the direction of an arrow by the rotation of the feed roll 31 and the winder roll 32. A rotational speed of the feed roll 31 and the winder roll 32 is controlled by a feed controller 7, which in turn controls the feeding speed of the long-sized substrate 10.

The long-sized substrate 10 is a semi-finished product, for example, of the manufacturing process of suspension board with a circuit. The semi-finished product includes a long-sized metal substrate made of stainless steel or the like, an insulating layer made of polyimide, for example, and a conductive layer made of copper, for example, and having a predetermined pattern. The conductive layer is a wiring, a pad electrode, or a ground conductor, for example.

The electroless plating apparatus 1 includes a potentiostat 3, a pair of conductive members 4, a reference electrode 5, and a counter electrode 6. One of the conductive members 4 is disposed in the upstream of the plating tank 2 and is in electrically contact with the conductive layer of the long-sized substrate 10, while the other conductive member 4 is disposed in the downstream of the plating tank 2 and is in electrically contact with the conductive layer of the long-sized substrate 10. In this case, the conductive layer of the long-sized substrate 10 acts as a working electrode.

The reference electrode 5 and the counter electrode 6 are immersed in the electroless plating solution 30 contained in the plating tank 2. The reference electrode 5 is a saturated caromel electrode, for example. The counter electrode 6 is an insoluble electrode made of platinum (Pt), for example. The counter electrode 6 acts as an anode (positive electrode) and the long-sized substrate acts as a cathode.

The conductive member 4, the reference electrode 5, and the counter electrode 6 are connected to the potentiostat 3. The potentiostat 3 controls an electric current that flows between the conductive layer (working electrode) of the long-sized substrate 10 and the counter electrode 6 such that a potential of the conductive layer (working electrode) of the long-sized substrate 10 is at a constant level with respect to a potential of the reference electrode 5. Namely, the potentiostat 3 retains a constant potential difference between the conductive layer of the long-sized substrate 10 and the reference electrode 5. Preferably, the potential of the conductive layer (working electrode) of the long-sized substrate 10 is kept at a constant value at or below −75V and is set to any value as long as it is below the deposition potential of nickel. The potential of the conductive layer (working electrode) of the long-sized substrate 10 with reference to the potential of the reference electrode 5 is retained at about −0.8V.

(2) Example of Object and Electroless Plating Method

Figure 2:
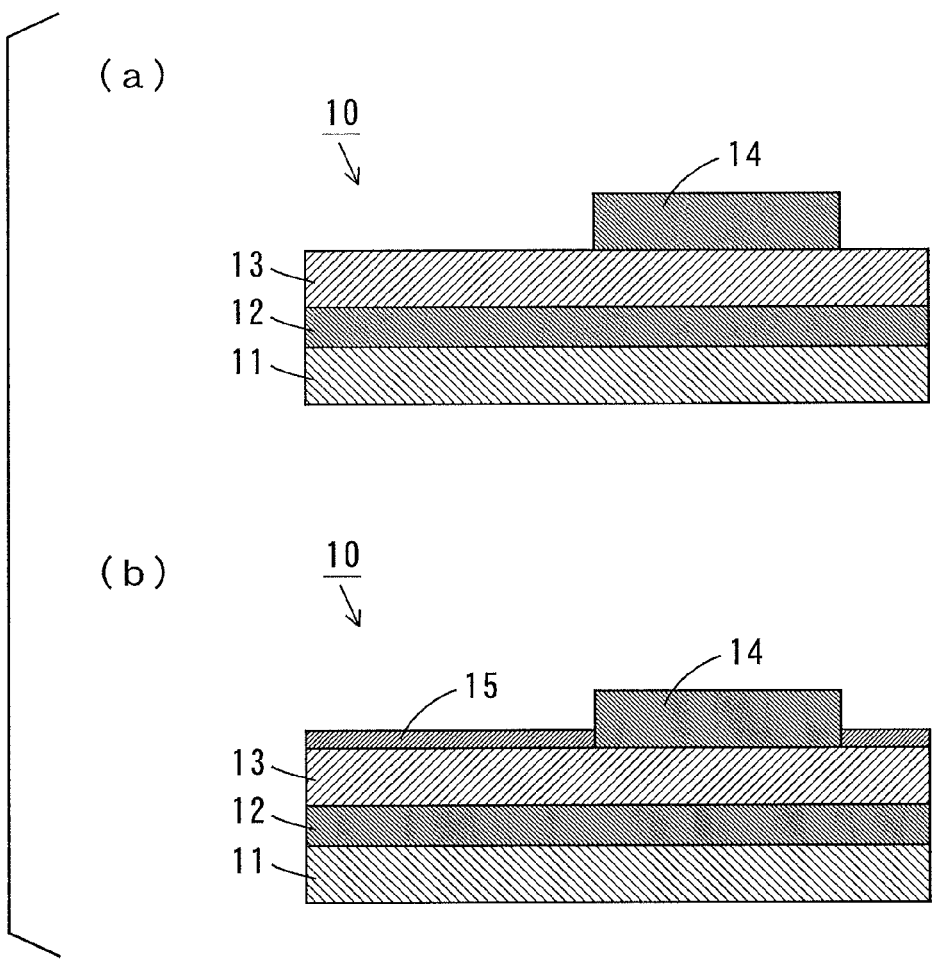
FIGS. 2(a) and (b) are schematic sectional views showing an example of an object.

FIG. 2 shows schematic sectional views of an example of an object. FIG. 2(*a*) shows the object before the electroless plating, and FIG. 2(*b*) shows the object after the electroless plating.

The object of FIG. 2 is a suspension board with a circuit made by using the long-sized substrate 10 of FIG. 1. FIG. 2 shows part of the suspension board with a circuit. As shown in FIG. 2(*a*), the long-sized substrate 10 includes a metal substrate 11 made of stainless steel, for example. An insulating layer 12 made of polyimide, for example, a conductive layer 13 made of copper, and an insulating layer 14 made of polyimide, for example, are sequentially formed on the metal substrate 11. The insulating layer 14 is arranged such that a part of the surface of the conductive layer 13 is exposed.

In the manufacturing process of the suspension board with a circuit, a metal thin film 15 made of nickel, for example, is formed on the exposed surface of the conductive layer 13 by electroless plating, as shown in FIG. 2(*b*). A thickness of the metal thin film 15 is from 0.03 μm to 5 μm, for example.

During the electroless plating of the long-sized substrate 10, the electroless plating solution 30 is accommodated in the plating tank 2 of FIG. 1. In addition, the reference electrode 5 and the counter electrode 6 are disposed in contact with the electroless plating solution 30. The conductive member 4 is disposed in electrically contact with the conductive layer 13 of the long-sized substrate 10.

In this example, a part of the conductive layer 13 of the long-sized substrate 10 is connected to the metal substrate 11. In this case, the conductive members 4 may be provided to be in contact with the metal substrate 11.

In this state, the feed controller 7 starts rotation of the feed roll 31 and the winder roll 32, so as to move the long-sized substrate 10 in the electroless plating solution 30 in the plating tank 2 at a constant speed. During the transportation of the long-sized substrate 10, the potentiostat 3 controls the electric current that flows between the conductive layer 13 of the long-sized substrate 10 and the counter electrode 6, so that the potential of the conductive layer 13 of the long-sized substrate 10 is at a constant level with respect to the potential of the reference electrode 5. As a result, the metal thin film 15 made of nickel is formed on the exposed surface of the conductive layer 13 of the long-sized substrate 10.

(3) Effects of the Embodiment

The electroless plating apparatus 1 according to the present embodiment allows the maintenance of the potential of the conductive layer 13 of the long-sized substrate 10 at a constant level with respect to the potential of the reference electrode 5. As a result, a metal deposition rate in the electroless plating solution 30 can be kept at a constant level even when the quality of the electroless plating solution 30 deteriorates.

Accordingly, it is possible to form a uniform metal thin film 15 made of nickel on the surface of the conductive layer 13 of the long-sized substrate 10. This facilitates the control of the feeding speed of the long-sized substrate 10 by the feed controller 7 during the elecctroless plating.

Employing the potentiostat 3 also facilitates the maintenance of the potential of the conductive layer 13 of the long-sized substrate 10 at a constant level with respect to the potential of the reference electrode 5.

(4) Other Embodiments

In the above embodiment, the electroless plating solution 30 includes nickel ions, but it is not limited thereto. For instance, the electroless plating solution 30 may include various metal ions or alloys, such as gold (Au), tin (Sn), silver (Ag), copper (Cu), a tin alloy, a copper alloy, or the like.

In the above embodiment, the object is the conductive layer 13 made of copper of the long-sized substrate 10, but the object is not limited thereto. The object may be made of another metal or an alloy such as a copper alloy, nickel (Ni), aluminum (Al), silver (Ag), tin (Sn), or a tin alloy.

Also, in the above embodiment, the object is the long-sized substrate 10 that is a semi-finished product of the suspension board with a circuit, but the object is not limited thereto. The object may be another printed circuit board such as a flexible printed circuit board or a rigid printed circuit board, or a semi-finished product thereof. Further, the object is not limited to the printed circuit board and electroless plating can be performed on various objects using the electroless plating apparatus 1.

In the above embodiment, by the electroless plating of the roll-to-roll system, the conductive layer 13 is subjected to elecctroless plating while the long-sized substrate 10 is moved, but the present invention is also applicable to an electroless plating apparatus of the batch system. In the elecctroless plating apparatus of the batch system, the object is immersed for a fixed period of time in the electroless plating solution in the plating tank without being moved. In this case, a metal deposition rate in the elecctroless plating solution is kept constant, even when the deterioration of the electroless plating solution proceeds. Thus, by controlling the time during which the object is immersed in the elecctroless plating solution to be fixed, a uniform metal thin film can be provided on the surface of the object.

Further, the above embodiment employs the potentiostat 3 as an example of the controller. Alternatively, other control circuits may be used as a controller instead of the potentiostat 3.

(5) Examples

Figure 3:
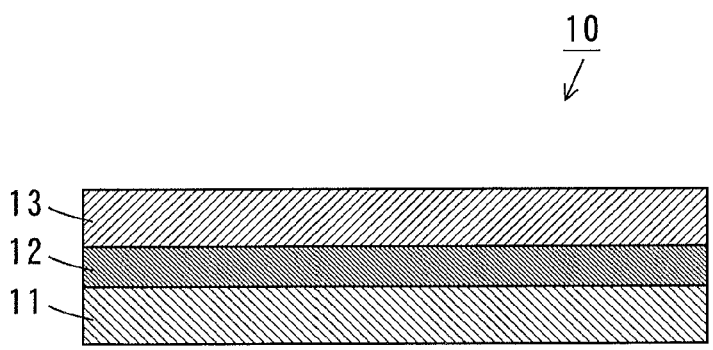
FIG. 3 is a sectional view along a width direction of a long-sized substrate used in an inventive example and comparative examples 1, 2 and 3.

In an inventive example and comparative examples 1, 2 and 3, a metal thin film made of nickel was formed by electroless plating on the surface of the long-sized substrate 10 having the configuration of FIG. 3.

FIG. 3 is a sectional view along a width direction of a long-sized substrate 10 used in the inventive example and the comparative examples 1, 2 and 3. As shown in FIG. 3, the long-sized substrate 10 includes a metal substrate 11 made of stainless steel. On the metal substrate 11, an insulating layer 12 made of polyimide and a conductive layer 13 made of copper are formed sequentially. The conductive layer 13 is electrically connected to the metal substrate 11 at a portion which is not shown. The long-sized substrate 10 has a width of 30 cm.

As will be described below, the metal thin film made of nickel was formed on the surface of the conductive layer 13 of the long-sized substrate 10 by the electroless plating.

Figure 4:
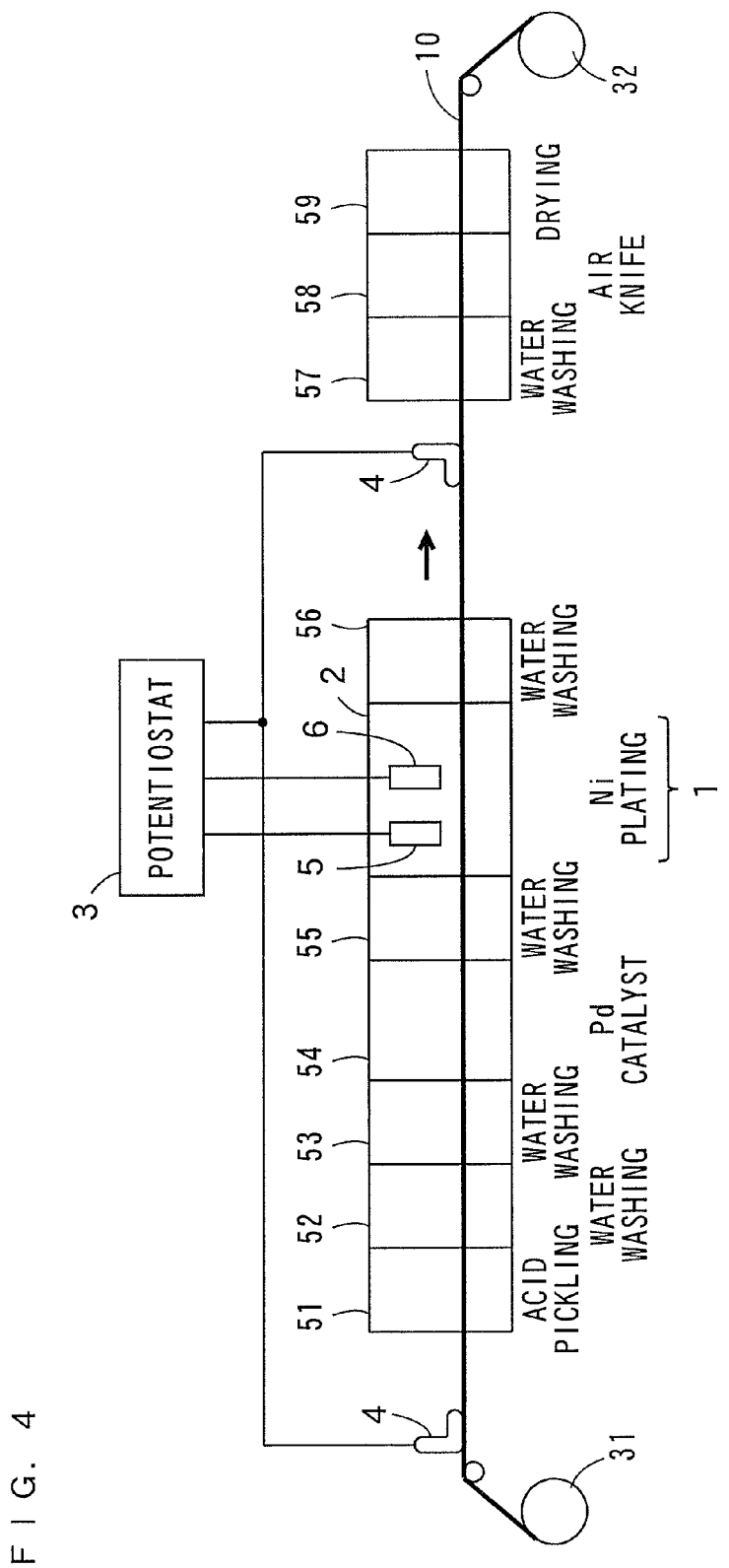
FIG. 4 is a schematic diagram of an electroless plating system used to perform electroless plating on the long-sized substrate of FIG. 3 in the inventive example.

FIG. 4 is a schematic diagram of an electroless plating system used to perform elecctroless plating on the long-sized substrate 10 of FIG. 3 in the inventive example.

In the electroless plating system of FIG. 4, an acid pickling treatment tank 51, water washing treatment tanks 52, 53, a Pd (palladium) catalyst treatment tank 54 and a water washing treatment tank 55 are arranged sequentially at the upstream side of the electroless plating apparatus 1. At the downstream side of the elecctroless plating apparatus 1, water washing treatment tanks 56, 57 and an air knife treatment tank 58, and a drying treatment tank 59 are arranged sequentially. The configuration of the electroless plating apparatus 1 is similar to that of that shown in FIG. 1.

The long-sized substrate 10 fed from the feed roller 31 passes the treatment tanks 51 to 55, the electroless plating apparatus 1 and the treatment tanks 57 to 59, and is wound by a winder roll 32.

The long-sized substrate 10 is subjected to acid pickling and water washing, successively, in the acid pickling treatment tank 51 and the water washing tanks 52, 53, respectively. In addition, a palladium (Pd) catalyst is attached to the surface of the long-sized substrate 10 in the Pd catalyst treatment tank 54. Thus, the metal thin film made of nickel (Ni thin film) is formed on the surface of the conductive layer 13 of the long-sized substrate 10 in the electroless plating apparatus 1. After that, the long-sized substrate 10 is subjected to water washing in the water washing treatment tanks 56, 57, followed by blowing off of the water attached to the surface of the long sized substrate 10 in the air knife treatment tank 58, and then the long-sized substrate 10 is dried in the drying treatment tank 59.

Figure 5:
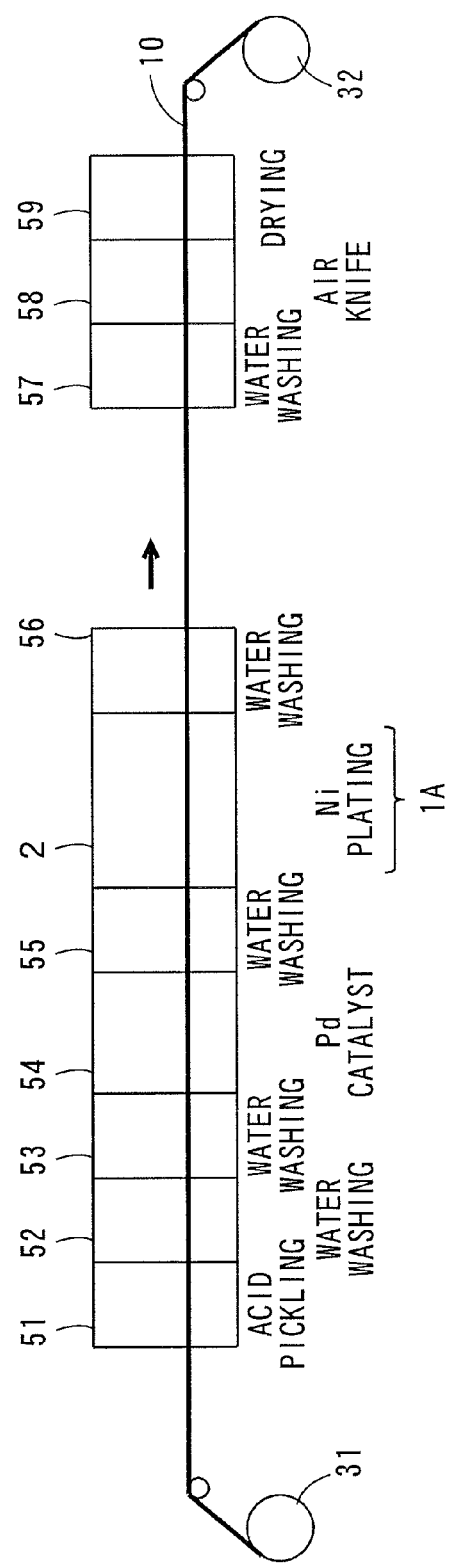
FIG. 5 is a schematic diagram of an electroless plating system used to perform electroless plating on the long-sized substrate of FIG. 3 in the comparative example 1.

FIG. 5 is a schematic diagram of an electroless plating system used to perform electroless plating of the long-sized substrate 10 of FIG. 3 in the comparative example 1.

In the elecctroless plating system of FIG. 5, an electroless plating apparatus 1A is provided instead of the electroless plating apparatus 1 of FIG. 4. The electroless plating apparatus 1A includes the plating tank 2 that contains the elecctroless plating solution. The elecctroless plating apparatus 1A does not include the potentiostat 3, the conductive member 4, the reference electrode 5, and the counter electrode 6 shown in FIG. 4.

Figure 6:
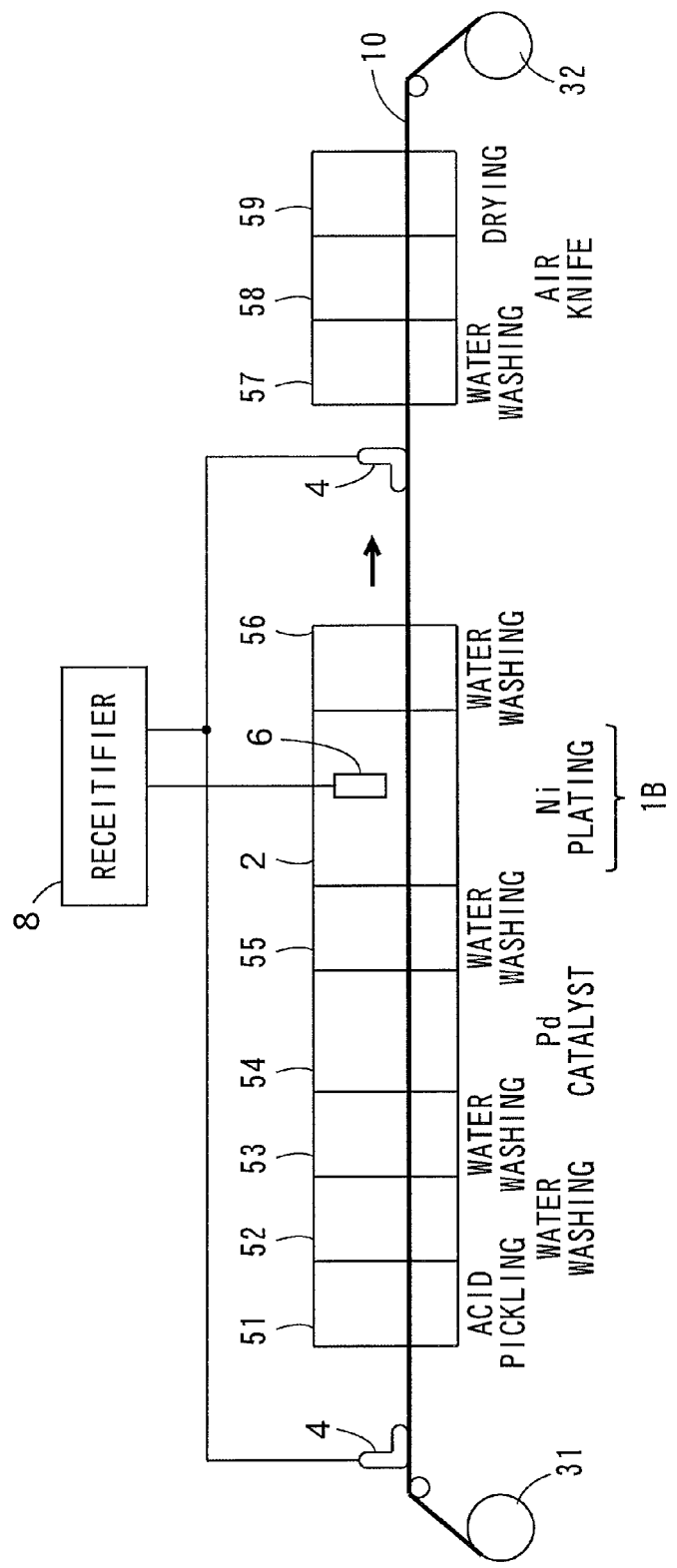
FIG. 6 is a schematic diagram of an electroless plating system used to perform electroless plating on the long-sized substrate of FIG. 3 in the comparative examples 2 and 3.

FIG. 6 is a schematic diagram of an electroless plating system used to perform electroless plating of the long-sized substrate 10 of FIG. 3 in the comparative examples 2, 3.

In the electroless plating system of FIG. 6, an electroless plating apparatus 1B is provided instead of the electroless plating apparatus 1 of FIG. 4. In the electroless plating apparatus 1B, a rectifier 8 is provided instead of the potentiostat 3 of FIG. 4. The rectifier 8 is connected to the conductive member 4 and the counter electrode 6. Also, it is noted that the reference electrode 5 of FIG. 4 is not provided.

In the inventive example and the comparative examples 1 to 3, a catalyst treatment was performed for 1 minute at 30° C. in the Pd catalyst treatment tank 54, using ICP Accela from Okuno Chemical Industries, Co., Ltd. as a catalyst. In contrast, an electroless plating was performed for 6 minutes at 82° C. in the electroless plating apparatuses 1,1A and 1B, using ICP Nicoron from Okuno Chemical Industries, Co., Ltd. as an elecctroless plating solution containing Ni. A feeding speed of the long-sized substrate 10 was 1 m/min. (fixed).

In the inventive example, the potentiostat 3 of FIG. 4 was employed to maintain the potential of the conductive layer 13 of the long-sized substrate 10 at a constant value of −0.83V with respect to the potential of the reference electrode 5.

In the comparative example 1, the potential of the conductive layer 13 of the long-sized substrate 10 was not controlled. In the comparative example 2, the rectifier of FIG. 6 was employed to flow an electric current of 70 mA between the counter electrode 6 and the conductive layer 13 of the long-sized substrate 10 for 30 seconds after the start of the electroless plating. In the comparative example 3, the rectifier 8 of FIG. 6 was employed to flow an electric current of 70 mA between the counter electrode 6 and the conductive layer 13 of the long-length substrate 10 continuously during the electroless plating.

Table 1 below shows average thickness of the Ni thin film formed on the surface of the conductive layer 13 of the long-length substrate 10 in the inventive example and the comparative examples 1 to 3.

TABLE 1

| | THICKNESS OF Ni THIN FILM ($\mu m$) | | | |
|---|---|---|---|---|
| | NEW SOLUTION | AFTER 1000 M TREATMENT | AFTER 2000 M TREATMENT | AFTER 3000 M TREATMENT |
| INVENTIVE EXAMPLE | 0.85 | 0.92 | 0.81 | 0.86 |
| COMPARATIVE EXAMPLE 1 | 1.03 | 0.78 | 0.68 | NO DEPOSITION |
| COMPARATIVE EXAMPLE 2 | 0.98 | 0.85 | 0.78 | 0.65 |
| COMPARATIVE EXAMPLE 3 | 1.05 | 0.93 | 0.83 | 0.85 |

Average thicknesses of the Ni thin film formed on the surface of the conductive layer 13 of the long-sized substrate 10 were measured at timings when the electroless plating solution was new (new solution), and when the elecctroless plating was done for 1000 m, 2000 m and 3000 m, respectively, of the long-sized substrate 10. The average thicknesses of the Ni thin film are average values of thickness measurements of the Ni thin film at several locations in the width direction of the long-sized substrate 10.

As shown in Table 1, in the inventive example, the average thicknesses of the Ni thin film of four measurements were 0.85 $\mu m$, 0.92 $\mu m$, 0.81 $\mu m$ and 0.86 $\mu m$, and the variation (difference between the maximum and minimum average thicknesses) was 0.11 $\mu m$. In this case, no decrease in thickness of the Ni thin film caused by deterioration of the electroless plating solution was observed.

In the comparative example 1, the average thicknesses of the Ni thin film of three measurements were 1.03 $\mu m$, 0.78 $\mu m$ and 0.68 $\mu m$, and the variation (difference between the maximum and minimum average thicknesses) was 0.35 $\mu m$. Deposition of Ni was not found on the surface of the conductive layer 13 at the time when the treatment had been done for 3000 m of the long-sized substrate 10. In this case, a conspicuous tendency of thickness decrease of the Ni film due to the deterioration of the electroless plating solution appeared.

In comparative example 2, the average thicknesses of the Ni thin film of four measurements were 0.98 $\mu m$, 0.85 $\mu m$, 0.78 $\mu m$ and 0.65 $\mu m$, and the variation (difference between the maximum and minimum average thicknesses) was 0.33

μm. In this case, a conspicuous tendency of thickness decrease of the Ni film due to the deterioration of the electroless plating solution also appeared.

In comparative example 3, average thicknesses of the Ni thin film of four measurements were 1.05 μm, 0.93 μm, 0.83 μm and 0.85 μm, and the variation (difference between the maximum and minimum average thicknesses) was 0.22 μm. In this case, there was a tendency of thickness decrease of the Ni thin film due to the deterioration of the electroless plating solution. Also, at an early stage of treatment when the electroless plating solution was new, there was no effect of the flow of the electric current between the counter electrode 6 and the conductive layer 13 of the long-seized substrate 10.

As can be seen from the above, in the inventive example the variation of the average thicknesses was small in comparison to the comparative examples 1 to 3 and the thickness of the Ni film was not decreased even when the electroless plating solution was deteriorated. Thus, it is found that a uniform Ni thin film made of nickel is formed on the surface of the conductive layer 13 of the long-sized substrate 10 without changing the feeding speed of the long-sized substrate 10 by maintaining the potential of the conductive layer of the long-sized substrate 10 at a constant level with respected to the potential of the reference electrode 5, even when the deterioration of the electroless plating solution 30 proceeds.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. An electroless plating apparatus that performs electroless plating on an object having a conductive portion, comprising:
   a plating tank for containing an electroless plating solution;
   a first roller configured to feed said object to said plating tank;
   a second roller configured to wind said object being fed from said plating tank;
   a feed controller configured to control a feeding speed of said object at a constant level;
   a conductive member arranged to be in contact with said conductive portion of said object;
   a reference electrode arranged to be in contact with said electroless plating solution in said plating tank; and
   a controller configured to maintain a potential of said conductive portion of said object at a constant level with respect to a potential of said reference electrode during electroless plating of said object,
   wherein said controller is electronically connected to said reference electrode and said conductive member.

2. The electroless plating apparatus according to claim 1, further comprising a counter electrode arranged to be in contact with said electroless plating solution contained in said plating tank, wherein said controller controls an electric current that flows between said conductive portion of said object and said counter electrode such that a potential of said conductive portion of said object with respect to a potential of said reference electrode is at a constant level.

3. The electroless plating apparatus according to claim 1, wherein said controller includes a potentiostat which is connected to said conductive member, said reference electrode and said counter electrode.

4. The electroless plating apparatus according to claim 1, wherein said object having the conductive portion functions as a working electrode.

* * * * *